(12) United States Patent
Shimabayashi et al.

(10) Patent No.: US 11,929,403 B2
(45) Date of Patent: Mar. 12, 2024

(54) METHOD OF MANUFACTURING SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Masaharu Shimabayashi, Kanazawa Ishikawa (JP); Tatsuya Shiraishi, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 212 days.

(21) Appl. No.: 17/471,599

(22) Filed: Sep. 10, 2021

(65) Prior Publication Data

US 2022/0093750 A1 Mar. 24, 2022

(30) Foreign Application Priority Data

Sep. 18, 2020 (JP) .................................. 2020-156928

(51) Int. Cl.
*H01L 29/40* (2006.01)
*H01L 21/28* (2006.01)
*H01L 29/51* (2006.01)
*H01L 29/66* (2006.01)
*H01L 29/78* (2006.01)

(52) U.S. Cl.
CPC .......... *H01L 29/401* (2013.01); *H01L 29/407* (2013.01); *H01L 29/512* (2013.01); *H01L 29/513* (2013.01); *H01L 29/66734* (2013.01); *H01L 29/7813* (2013.01); *H01L 21/28194* (2013.01); *H01L 21/28202* (2013.01); *H01L 21/28229* (2013.01); *H01L 29/518* (2013.01)

(58) Field of Classification Search
CPC ... H01L 29/401; H01L 29/407; H01L 29/512; H01L 29/513; H01L 29/66734; H01L 29/7813; H01L 21/28194; H01L 21/28202; H01L 21/28229; H01L 29/518; H01L 29/41766; H01L 29/66727; H01L 29/7843; H01L 21/76227
See application file for complete search history.

(56) References Cited

U.S. PATENT DOCUMENTS 5,572,480 A * 11/1996 Ikeda ..................... H10B 10/12
257/385
9,029,979 B2 5/2015 Yoshimoto et al.
(Continued)

FOREIGN PATENT DOCUMENTS

JP 2006-510217 A 3/2006
JP 2007-242943 A 9/2007
(Continued)

*Primary Examiner* — Shahed Ahmed
*Assistant Examiner* — Khatib A Rahman
(74) *Attorney, Agent, or Firm* — Kim & Stewart LLP

(57) ABSTRACT

A method of manufacturing a semiconductor device includes: forming a trench in a semiconductor layer of first conductivity type; in the trench, forming a first layer containing silicon and then forming a second layer containing first oxide or nitride on the first layer or forming the second layer and then forming the first layer on the second layer; and thermally oxidizing the first layer.

9 Claims, 18 Drawing Sheets

(56) References Cited

U.S. PATENT DOCUMENTS

| | | | |
|---|---|---|---|
| 2006/0205222 A1 | 9/2006 | In't Zandt et al. | |
| 2008/0029809 A1 | 2/2008 | Morioka et al. | |
| 2012/0241817 A1 | 9/2012 | Saito et al. | |
| 2013/0302934 A1* | 11/2013 | Kato | H10N 30/08 |
| | | | 438/53 |
| 2017/0373183 A1 | 12/2017 | Yamashita et al. | |
| 2018/0083110 A1* | 3/2018 | Kobayashi | H01L 29/41 |

FOREIGN PATENT DOCUMENTS

| | | |
|---|---|---|
| JP | 2008-041899 A | 2/2008 |
| JP | 2012-199444 A | 10/2012 |
| JP | 5852863 B2 | 2/2016 |
| JP | 2017-228679 A | 12/2017 |
| JP | 2018-046253 A | 3/2018 |

* cited by examiner

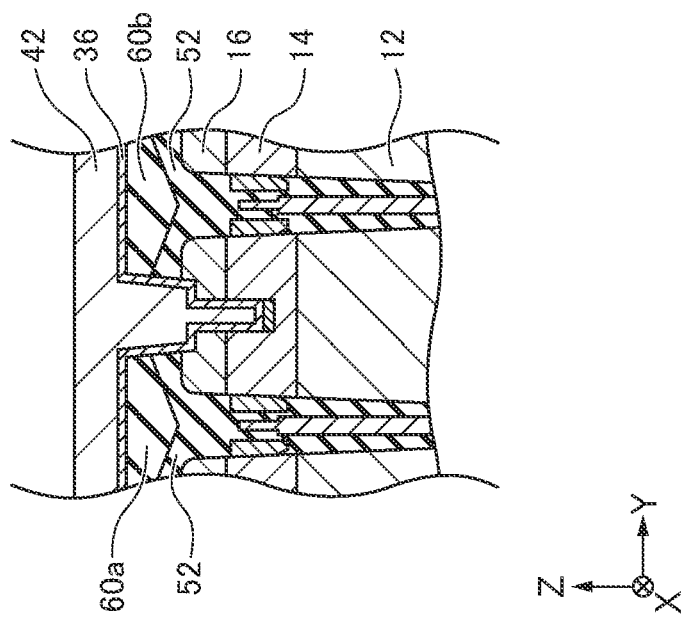
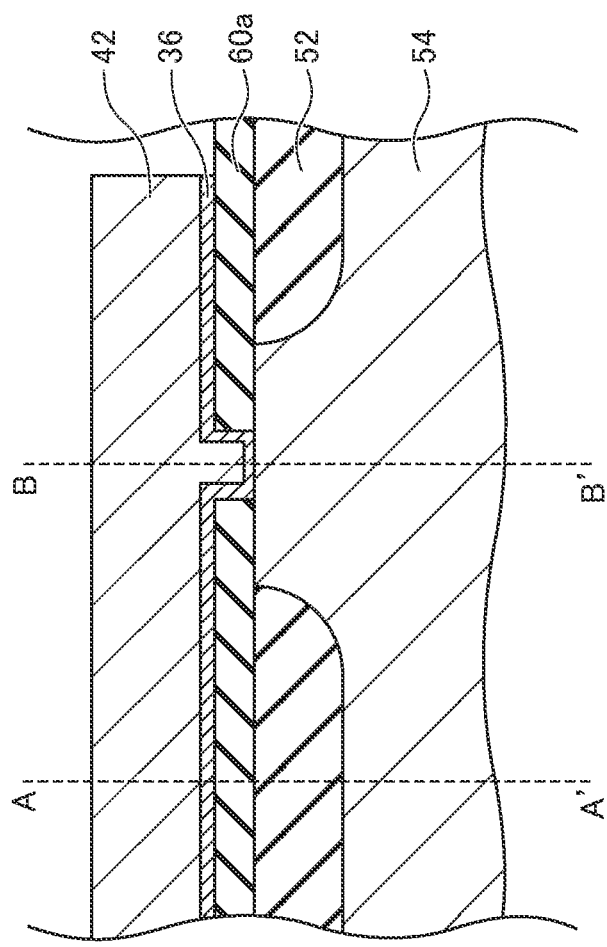

FIG.6
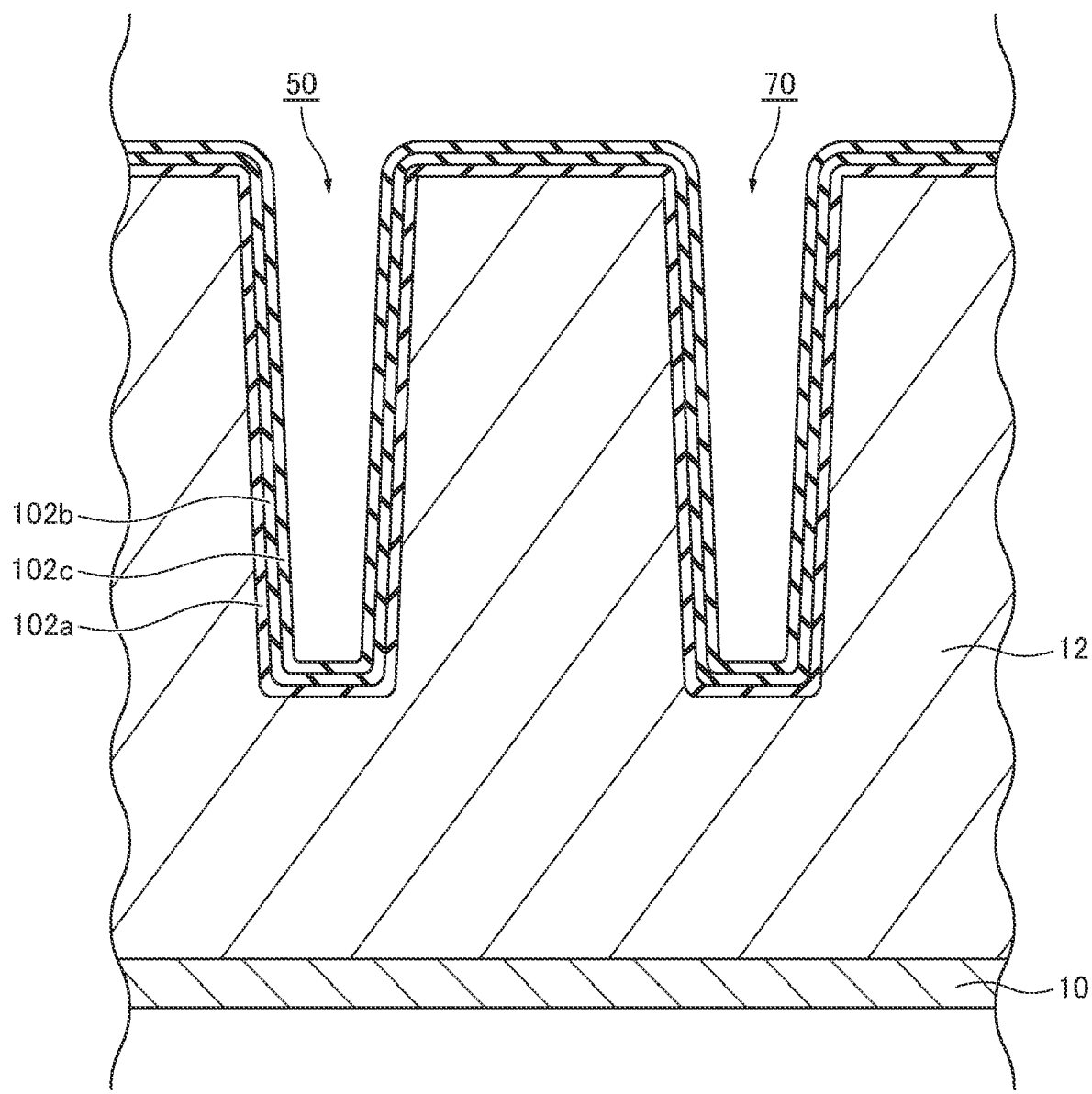
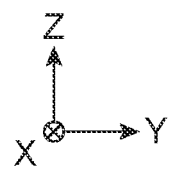

FIG.7
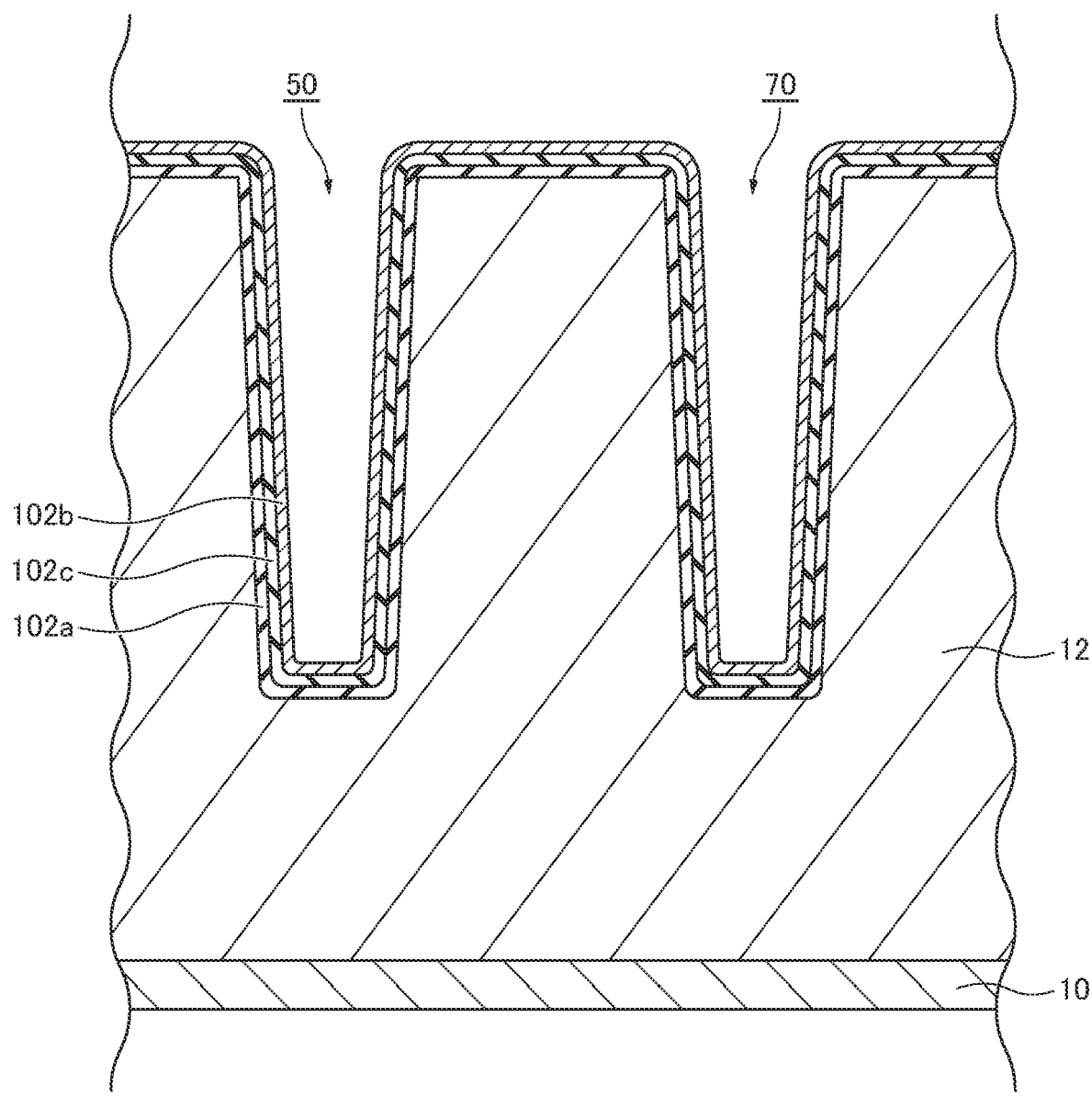
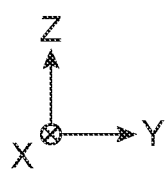

METHOD OF MANUFACTURING SEMICONDUCTOR DEVICE

CROSS-REFERENCE TO RELATED APPLICATION

This application is based upon and claims the benefit of priority from Japanese Patent Application No. 2020-156928, filed on Sep. 18, 2020, the entire contents of which are incorporated herein by reference.

FIELD

Embodiments described herein relate generally to a semiconductor device.

BACKGROUND

Semiconductor devices, such as a metal oxide semiconductor field effect transistor (MOSFET), are used in applications such as power conversion. For such semiconductor devices, it is preferable that the on-resistance is low.

BRIEF DESCRIPTION OF THE DRAWINGS

FIGS. 3A and 3B are schematic cross-sectional views of a semiconductor device of embodiments;

FIG. 6 is a schematic cross-sectional view showing a manufacturing step of the first aspect of the semiconductor device of embodiments;

FIG. 7 is a schematic cross-sectional view showing a manufacturing step of a second aspect of the semiconductor device of embodiments;

DETAILED DESCRIPTION

Figure 1:
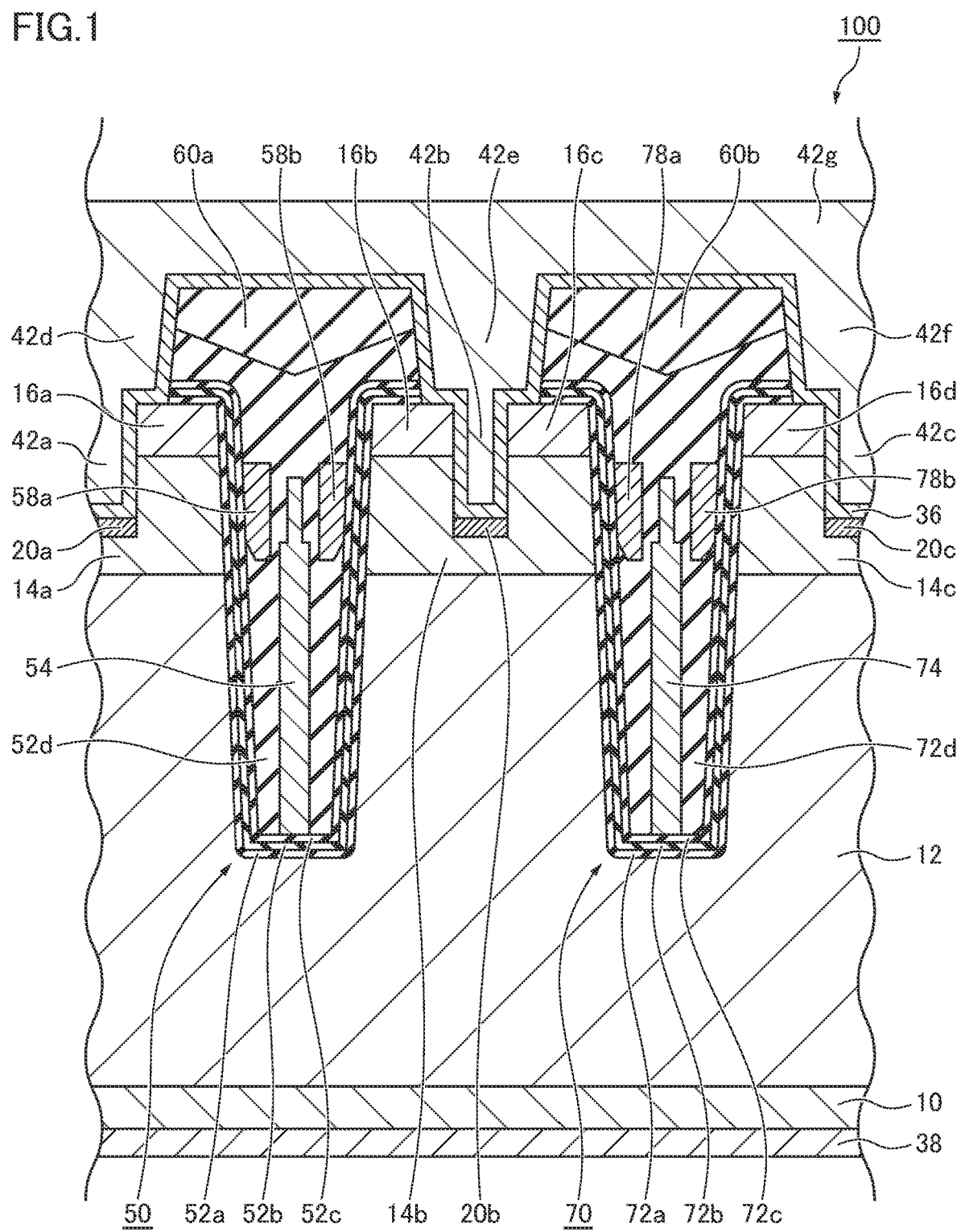
FIG. 1 is a schematic cross-sectional view of a semiconductor device of embodiments.

Hereinafter, embodiments will be described with reference to the diagrams. In the following description, the same members and the like are denoted by the same reference numerals, and the description of the members and the like once described will be omitted as appropriate.

In this specification, the concepts of "upper" and "lower" do not necessarily indicate the relationship with the direction of gravity.

Hereinafter, a case where the first conductivity type is n type and the second conductivity type is p type will be described as an example.

In the following description, when there are notations of $n^+$, n, $n^-$, $p^+$, p, and $p^-$, these indicate the relative high and low of the impurity concentration in each conductivity type. That is, n+ indicates that the n-type impurity concentration is relatively higher than n, and v-indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type.

(Embodiments)

A method of manufacturing a semiconductor device of embodiments includes: forming a trench in a semiconductor layer of first conductivity type; in the trench, forming a first layer containing silicon and then forming a second layer containing first oxide or nitride on the first layer or forming the second layer and then forming the first layer on the second layer; and thermally oxidizing the first layer.

FIG. 1 is a schematic cross-sectional view of a semiconductor device 100 of embodiments. The semiconductor device 100 is, for example, a vertical MOSFET.

The semiconductor device 100 includes a drain layer 10, a drift layer 12, a base region 14, a source region 16, a $p^+$ region 20, a barrier metal 36, a drain electrode 38, a source electrode 42, a first trench 50, a third layer 52a, a first layer 52b, a second layer 52c, an insulating layer 52d, a first field plate electrode 54, a first gate electrode 58, an interlayer insulating film 60, a second trench 70, a sixth layer 72a, a fourth layer 72b, a fifth layer 72c, an insulating layer 72d, a second field plate electrode 74, and a second gate electrode 78.

In addition, the drift layer 12 is an example of the semiconductor layer. The base region 14 is an example of a first semiconductor region. The source region 16 is an example of a second semiconductor region. The gate electrode 58 is an example of a first electrode. The drain electrode 38 is an example of a third electrode. The source electrode 42 is an example of a second electrode.

The drain layer 10 is a layer that functions as a drain of the MOSFET. The drain layer 10 contains, for example, an $n^+$-type semiconductor material.

The drain electrode 38 is provided below the drain layer 10 and is electrically connected to the drain layer 10. The drain layer 10 is provided between the drain electrode 38 and the drift layer 12. The drain electrode 38 is an electrode that functions as a drain electrode of the MOSFET.

The drift layer 12 is provided on the drain layer 10.

The drift layer 12 is a layer that functions as a drift layer of the MOSFET. The drift layer 12 contains, for example, an n⁻-type semiconductor material.

Here, an X direction, a Y direction perpendicular to the X direction, and a Z direction perpendicularly crossing the X and Y directions are defined. The drain electrode 38, the drain layer 10, and the drift layer 12 are layers provided in parallel with the XY plane parallel to the X and Y directions. The Z direction is a direction in which the drain electrode 38, the drain layer 10, and the drift layer 12 are stacked. FIG. 1 is a schematic cross-sectional view of the semiconductor device 100 of embodiments in the YZ plane.

The base region 14 is provided on the drift layer 12. The base region 14 is a region that functions as a base of the MOSFET. The base region 14 is a region that forms a channel when a voltage is applied to the first gate electrode 58 or the second gate electrode 78, so that carriers can flow between the source region 16 and the drain layer 10. The base region 14 contains, for example, a p⁻-type semiconductor material. In the semiconductor device 100, the base region 14 includes base regions 14a, 14b, and 14c.

The source region 16 is provided on the base region 14. The source region 16 is a region that functions as a source of the MOSFET. When an appropriate voltage is applied to the first gate electrode 58 or the second gate electrode 78, carriers flow between the source region 16 and the drain layer 10. The source region 16 contains, for example, an n⁺-type semiconductor material. In the semiconductor device 100, the source region 16 includes source regions 16a, 16b, 16c, and 16d.

The first trench 50 is provided so as to reach the drift layer 12 from the upper end of the base region 14.

The second trench 70 is provided so as to reach the drift layer 12 from the upper end of the base region 14.

The third layer 52a is provided in the first trench 50. The third layer 52a contains a second oxide. Here, the second oxide is, for example, silicon oxide.

The first layer 52b is provided on the third layer 52a in the first trench 50. The first layer 52b contains a silicon-oxidized material such as polysilicon and amorphous silicon. When the polysilicon contains a plurality of grains, the first layer 52b contains a plurality of silicon oxide grains.

The second layer 52c is provided on the first layer 52b in the first trench 50. The second layer 52c contains first oxide or nitride. Here, the first oxide is, for example, silicon oxide. In addition, here, the nitride is, for example, silicon nitride.

In FIG. 1, one first layer 52b and one second layer 52c are provided. However, for example, a stacked structure of the first layer 52b and the second layer 52c may be repeatedly provided on the third layer 52a as many times as necessary. In other words, another first layer 52b may be further provided on the second layer 52c. In addition, another second layer 52c may be further provided on the other first layer 52b.

In addition, the third layer 52a may not be provided.

The sixth layer 72a is provided in the second trench 70. The sixth layer 72a contains a second oxide. Here, the second oxide is, for example, silicon oxide.

The fourth layer 72b is provided on the sixth layer 72a in the second trench 70. The fourth layer 72b contains a silicon-oxidized material such as polysilicon and amorphous silicon. When the polysilicon contains a plurality of grains, the fourth layer 72b contains a plurality of silicon oxide grains.

The fifth layer 72c is provided on the fourth layer 72b in the second trench 70. The fifth layer 72c contains first oxide or nitride. Here, the first oxide is, for example, silicon oxide. In addition, here, the nitride is, for example, silicon nitride.

In FIG. 1, one fourth layer 72b and one fifth layer 72c are provided. However, for example, a stacked structure of the fourth layer 72b and the fifth layer 72c may be repeatedly provided on the sixth layer 72a as many times as necessary. In other words, another fourth layer 72b may be further provided on the fifth layer 72c. In addition, another fifth layer 72c may be further provided on the other fourth layer 72b.

In addition, the sixth layer 72a may not be provided.

The first field plate electrode 54 is provided in the first trench 50 so as to face the drift layer 12 with the third layer 52a, the first layer 52b, and the second layer 52c interposed between the first field plate electrode 54 and the drift layer 12. The first field plate electrode 54 is provided, for example, to increase a breakdown voltage by reducing the concentration of the reverse electric field between the first gate electrode 58 and the drain electrode 38. In addition, the first field plate electrode 54 may not be provided.

The second field plate electrode 74 is provided in the second trench 70 so as to face the drift layer 12 with the sixth layer 72a, the fourth layer 72b, and the fifth layer 72c interposed between the second field plate electrode 74 and the drift layer 12. The second field plate electrode 74 is provided, for example, to increase a breakdown voltage by reducing the concentration of the reverse electric field between the second gate electrode 78 and the drain electrode 38. In addition, if the first field plate electrode 54 is not provided, the second field plate electrode 74 may not be provided.

The first gate electrode 58 is provided in the first trench 50 so as to face the base region 14. In FIG. 1, the first gate electrode 58a is provided so as to face the base region 14a with the third layer 52a, the first layer 52b, and the second layer 52c interposed between the first gate electrode 58a and the base region 14a. In addition, the first gate electrode 58b is provided so as to face the base region 14b with the third layer 52a, the first layer 52b, and the second layer 52c interposed between the first gate electrode 58b and the base region 14b. The first gate electrode 58 is an electrode that functions as a gate of the MOSFET.

For example, the third layer 52a, the first layer 52b, and the second layer 52c between the first gate electrode 58a and the base region 14a function as a gate insulating film of the MOSFET. For example, the third layer 52a, the first layer 52b, and the second layer 52c between the first gate electrode 58b and the base region 14b function as a gate insulating film of the MOSFET.

The second gate electrode 78 is provided in the second trench 70 so as to face the base region 14. In FIG. 1, the second gate electrode 78a is provided so as to face the base region 14b with the sixth layer 72a, the fourth layer 72b, and the fifth layer 72c interposed between the second gate electrode 78a and the base region 14b. In addition, the second gate electrode 78b is provided so as to face the base region 14c with the sixth layer 72a, the fourth layer 72b, and the fifth layer 72c interposed between the second gate electrode 78b and the base region 14c. The second gate electrode 78 is an electrode that functions as a gate of the MOSFET.

For example, the sixth layer 72a, the fourth layer 72b, and the fifth layer 72c between the second gate electrode 78a and the base region 14b function as a gate insulating film of the MOSFET. For example, the sixth layer 72a, the fourth layer 72b, and the fifth layer 72c between the second gate electrode 78b and the base region 14c function as a gate insulating film of the MOSFET.

The interlayer insulating film 60a as the interlayer insulating film 60 is provided above the first gate electrode 58 and the first field plate electrode 54. The interlayer insulating film 60b as the interlayer insulating film 60 is provided above the second gate electrode 78 and the second field plate electrode 74.

In addition, the insulating layer 52d may be appropriately provided between the second layer 52c and the first field plate electrode 54, between the first gate electrode 58 and the first field plate electrode 54, and between the interlayer insulating film 60a and the first gate electrode 58 and the first field plate electrode 54 in the first trench 50.

In addition, the insulating layer 72d may be appropriately provided between the fifth layer 72c and the second field plate electrode 74, between the second gate electrode 78 and the second field plate electrode 74, and between the interlayer insulating film 60b and the second gate electrode 78 and the second field plate electrode 74 in the second trench 70.

The source electrode 42 has a first electrode portion 42a, a second electrode portion 42b, a third electrode portion 42c, a fourth electrode portion 42d, a fifth electrode portion 42e, a sixth electrode portion 42f, and a seventh electrode portion 42g. The seventh electrode portion 42g is provided on the interlayer insulating film 60. The fourth electrode portion 42d, the fifth electrode portion 42e, and the sixth electrode portion 42f are provided below the seventh electrode portion 42g. The first electrode portion 42a is provided below the fourth electrode portion 42d so as to reach the base region 14a. The second electrode portion 42b is provided below the fifth electrode portion 42e so as to reach the base region 14b. The third electrode portion 42c is provided below the sixth electrode portion 42f so as to reach the base region 14c. The source electrode 42 is an electrode that functions as a source of the MOSFET.

The $p^+$ region 20a is provided in the base region 14a between the first electrode portion 42a and the drain layer 10. The $p^+$ region 20b is provided in the base region 14b between the second electrode portion 42b and the drain layer 10. The $p^+$ region 20c is provided in the base region 14c between the third electrode portion 42c and the drain layer 10. The p-type impurity concentration in the $p^+$ region 20 is higher than the p-type impurity concentration in the base region 14. When a reverse voltage is applied to the MOSFET, if an electric potential difference is generated between the electric potential of the base region 14 and the electric potential of the source electrode 42, a parasitic bipolar transistor formed by the source region 16, the base region 14, and the drift layer 12 operates to cause element breakdown. Therefore, by providing the $p^+$ region 20 as a region having a hole conductivity higher than the hole conductivity of the base region 14 so that electric potential difference is difficult to be generated between the electric potential of the base region 14 and the electric potential of the source electrode 42, such element breakdown is suppressed.

The barrier metal 36 is provided between the source electrode 42 and each of the base region 14, the source region 16, the $p^+$ region 20, and the interlayer insulating film 60. The barrier metal 36 is a film used to prevent a reaction between the source electrode 42 and a semiconductor material used in the semiconductor device 100. The barrier metal 36 contains, for example, titanium (Ti), titanium nitride (TiN), tantalum (Ta), or tantalum nitride (TaN).

The semiconductor material used for the drain layer 10, the drift layer 12, the base region 14, the source region 16, and the $p^+$ region 20 is, for example, silicon (Si). However, the semiconductor materials used for the drain layer 10, the drift layer 12, the base region 14, the source region 16, and the $p^+$ region 20 may be other semiconductor materials, such as silicon carbide (SiC), gallium nitride (GaN), and gallium arsenide (GaAs).

When silicon is used as a semiconductor material, for example, arsenic (As), phosphorus (P), or antimony (Sb) can be used as an n-type impurity, and B (boron) can be used as a p-type impurity.

The first gate electrode 58, the second gate electrode 78, the first field plate electrode 54, and the second field plate electrode 74 contain a conductive material, such as polysilicon containing impurities.

The insulating layer 52d, the insulating layer 72d, and the interlayer insulating film 60 contain an insulating material such as silicon oxide or silicon nitride.

The drain electrode 38 and the source electrode 42 contain a metal, such as aluminum (Al).

Figure 2:
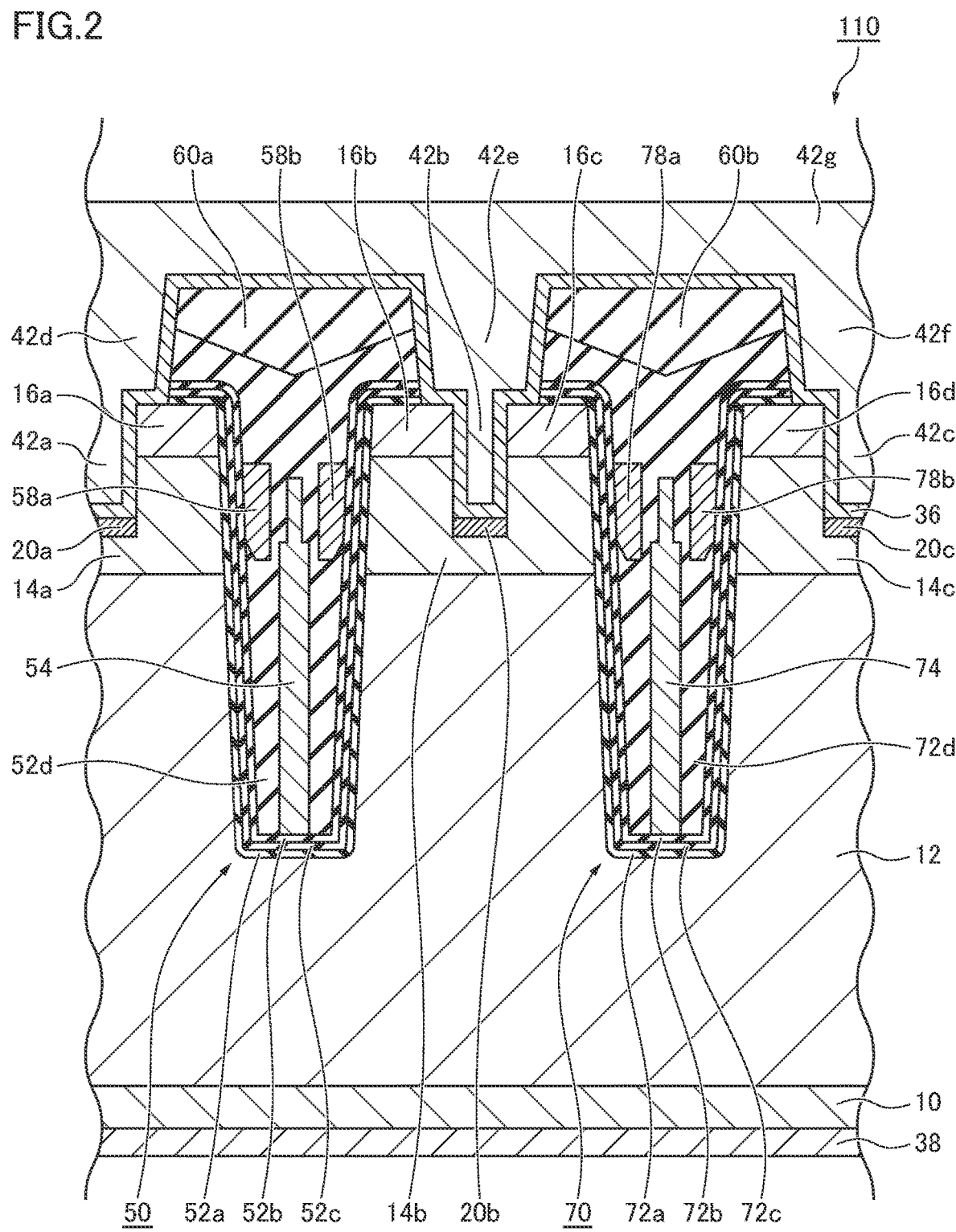
FIG. 2 is a schematic cross-sectional view of a semiconductor device of another aspect of embodiments.

FIG. 2 is a schematic cross-sectional view of a semiconductor device 110 of another aspect of embodiments. In the first trench 50, the second layer 52c is provided on the third layer 52a. In addition, the first layer 52b is provided on the second layer 52c. In addition, in the second trench 70, the fifth layer 72c is provided on the sixth layer 72a. In addition, the fourth layer 72b is provided on the fifth layer 72c. Others are the same as those of the semiconductor device 100 shown in FIG. 1. In addition, the third layer 52a and the sixth layer 72a may not be provided.

FIGS. 3A and 3B are schematic cross-sectional views of a semiconductor device of embodiments. FIG. 3A is a schematic cross-sectional view of the semiconductor device 100 of embodiments in the XZ plane. FIG. 3B is a schematic cross-sectional view of the semiconductor device 100 of embodiments within the A-A' cross section shown in FIG. 3A. The schematic cross-sectional view in the A-A' cross section shown in FIG. 3B corresponds to, for example, the schematic cross-sectional view shown in FIG. 1. In the B-B' cross section of FIG. 3A, the first field plate electrode 54 has an upwardly extending portion. Then, using this portion, the first field plate electrode 54 is electrically connected to the source electrode 42 via the barrier metal 36, for example. In addition, in FIG. 3B, the first layer 52b, the second layer 52c, the third layer 52a, and the insulating layer 52d are shown as an insulating layer 52. In addition, the first field plate electrode 54 may be electrically connected to the first gate electrode 58 in the first trench 50, for example.

Similarly, the second field plate electrode 74 is electrically connected to the source electrode 42. In addition, the second field plate electrode 74 may be electrically connected to the second gate electrode 78 in the second trench 70, for example.

Figure 4:
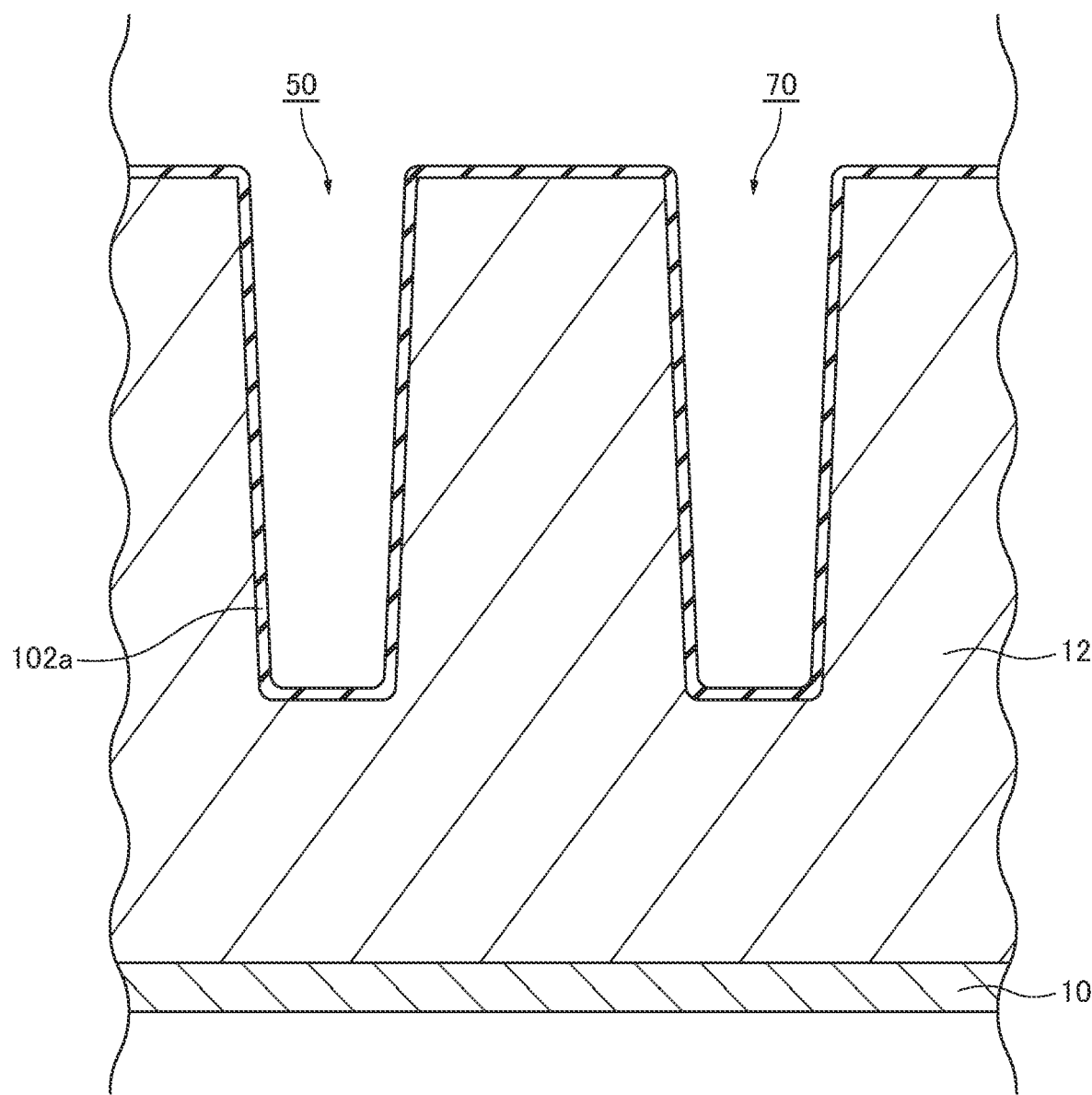
FIG. 4 is a schematic cross-sectional view showing a manufacturing step of a first aspect of the semiconductor device of embodiments.
Figure 5:
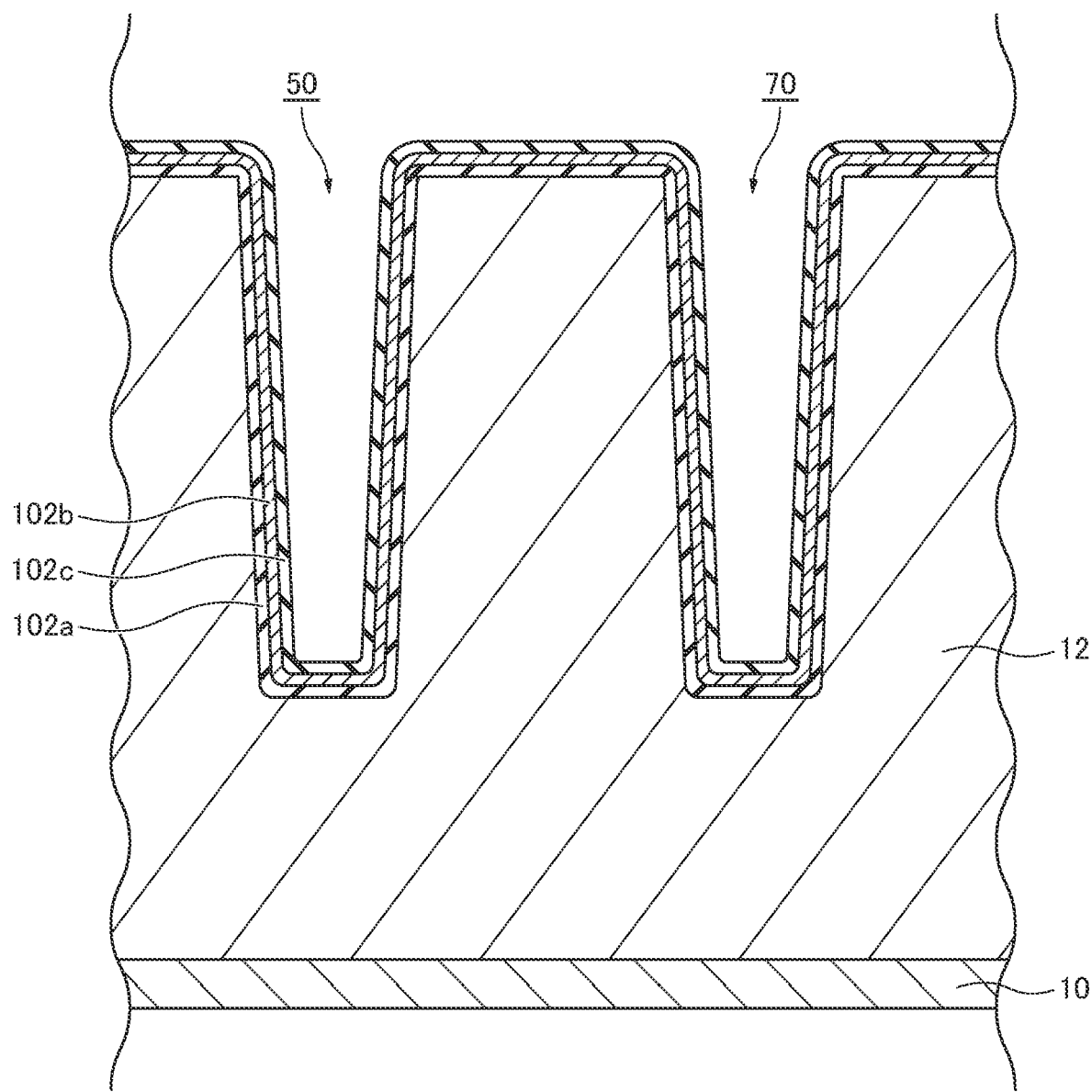
FIG. 5 is a schematic cross-sectional view showing a manufacturing step of the first aspect of the semiconductor device of embodiments.

FIGS. 4 to 6 are schematic cross-sectional views showing manufacturing steps of a first aspect of the semiconductor device of embodiments. FIGS. 4 to 6 are schematic cross-sectional views showing steps of manufacturing the semiconductor device 100 of embodiments shown in FIG. 1.

First, the drift layer 12 is formed on the drain layer 10 by, for example, epitaxial growth. For example, by using the drain layer 10 as a semiconductor substrate, the drift layer 12 is formed on the drain layer 10 by epitaxial growth. Then, the first trench 50 and the second trench 70 are formed in the drift layer 12 by using, for example, photolithography and reactive ion etching (RIE).

Then, a layer 102a containing second oxide is formed in the first trench 50 and the second trench 70 on the drift layer 12 using a thermal oxidation method. Here, the second oxide is, for example, silicon oxide (FIG. 4).

Then, a layer 102b containing silicon is formed on the layer 102a. For example, when forming the layer 102b containing polysilicon, it is preferable to form the layer 102b by using a reduced pressure chemical vapor deposition (CVD) method. In addition, when forming the layer 102b containing polysilicon, the layer 102b contains a plurality of polysilicon grains.

Then, a layer 102c containing first oxide or a nitride is formed on the layer 102b. Here, the first oxide is, for example, silicon oxide. In addition, the nitride is, for example, silicon nitride. When the first oxide is silicon oxide, it is preferable to form the layer 102c by using, for example, a plasma CVD method (an example of the CVD method). When the nitride is silicon nitride, it is preferable to form the layer 102c by using, for example, a reduced pressure CVD method (an example of the CVD method).

Then, the layer 102b is thermally oxidized. When the layer 102b contains polysilicon grains, the thermally oxidized layer 102b contains silicon oxide grains. Here, it can be clarified that the layer 102b contains silicon oxide grains by microscopic observation using a scanning electron microscope (SEM), a transmission electron microscope (TEM), and the like. In addition, due to thermal oxidation, the thickness of the layer containing polysilicon expands, for example, about twice. Therefore, it is preferable to determine the film thickness for forming the layer 102b containing polysilicon in consideration of such expansion.

In addition, the size of the polysilicon grain and the size of the silicon oxide grain are not particularly limited. For example, the size of the polysilicon grain and the size of the silicon oxide grain are about several hundred nm.

In addition, the layer 102a is an example of a third layer. The layer 102b is an example of a first layer. The layer 102c is an example of a second layer.

Then, the first field plate electrode 54, the second field plate electrode 74, the base region 14, the source region 16, the insulating layer 52d, the insulating layer 72d, the first gate electrode 58, the second gate electrode 78, the interlayer insulating film 60, the barrier metal 36, the source electrode 42, and the drain electrode 38 are appropriately formed to obtain the semiconductor device 100 of embodiments. For example, the semiconductor device 100 of embodiments is manufactured by using the manufacturing method described in JP 2018-046253 A. In addition, the layer 102a, the layer 102b, and the layer 102c in the first trench 50 become the third layer 52a, the first layer 52b, and the second layer 52c, respectively. In addition, the layer 102a, the layer 102b and the layer 102c in the second trench become the sixth layer 72a, the fourth layer 72b, and the fifth layer 72c, respectively.

In addition, the layer 102a may not be formed.

Figure 8:
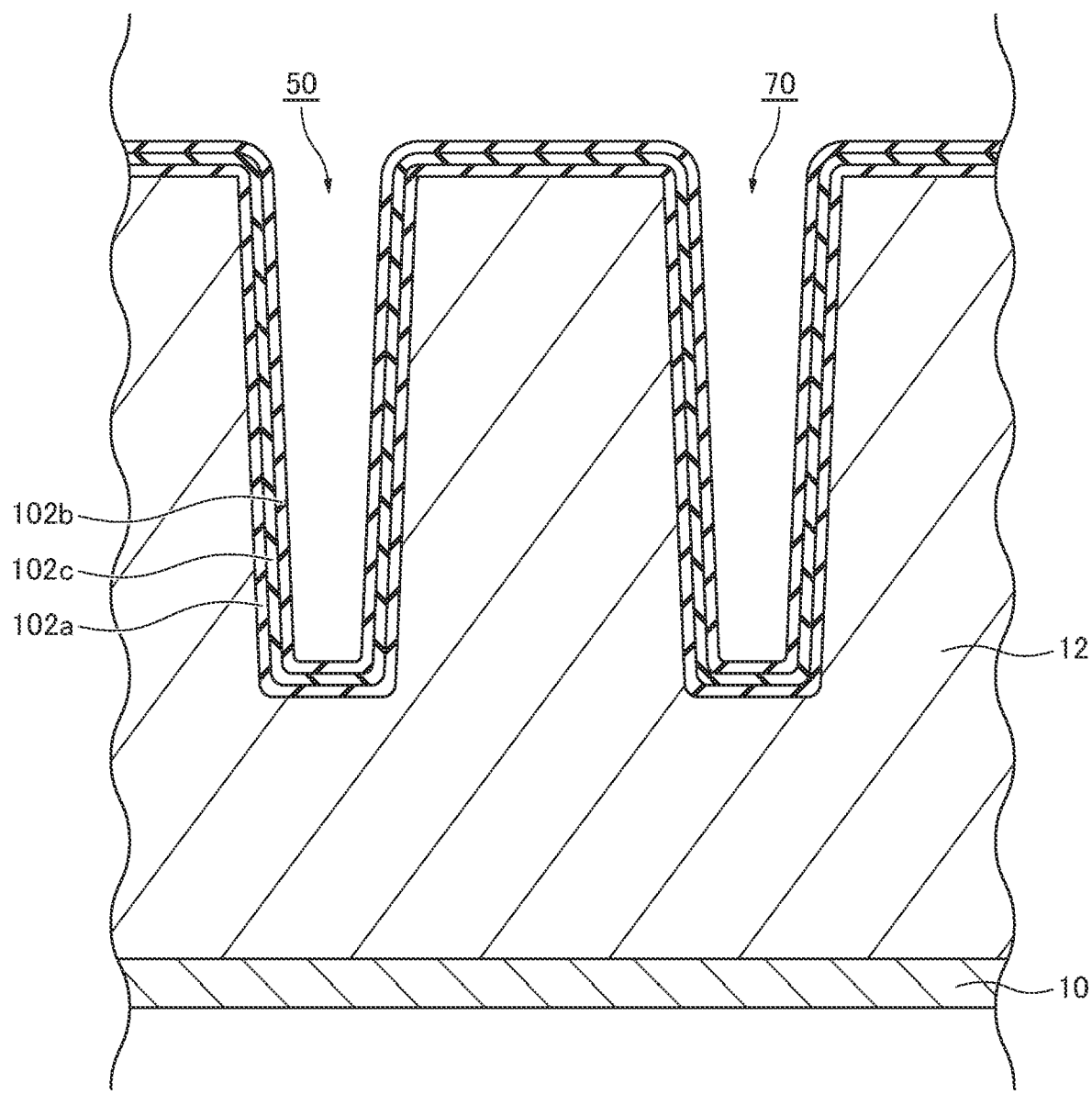
FIG. 8 is a schematic cross-sectional view showing a manufacturing step of the second aspect of the semiconductor device of embodiments.

FIGS. 7 and 8 are schematic cross-sectional views showing manufacturing steps of a second aspect of the semiconductor device of embodiments. FIGS. 7 and 8 are schematic cross-sectional views showing steps of manufacturing the semiconductor device 110 of embodiments shown in FIG. 2. Steps until the first trench 50 and the second trench 70 are formed in the drift layer 12 and the layer 102a containing second oxide is formed in the first trench 50 and the second trench 70 on the drift layer 12 using a thermal oxidation method are the same as the manufacturing steps of the first aspect of the semiconductor device of embodiments shown in FIGS. 4 to 6.

Then, the layer 102c containing first oxide or nitride is formed on the layer 102a. Here, the first oxide is, for example, silicon oxide. In addition, the nitride is, for example, silicon nitride. Then, the layer 102b containing silicon is formed on the layer 102c (FIG. 7).

Then, the layer 102b is thermally oxidized (FIG. 8). Subsequent steps are the same as the manufacturing steps of the first aspect of the semiconductor device of embodiments shown in FIGS. 4 to 6.

In addition, the layer 102a may not be formed.

FIGS. 9 to 14 are schematic cross-sectional views showing manufacturing steps of a third aspect of the semiconductor device of embodiments. Steps until the first trench 50 and the second trench 70 are formed in the drift layer 12 and the layer 102a containing second oxide is formed in the first trench 50 and the second trench 70 on the drift layer 12 using a thermal oxidation method are the same as the manufacturing steps of the first aspect of the semiconductor device of embodiments shown in FIGS. 4 to 6 and the manufacturing steps of the second aspect of the semiconductor device of embodiments shown in FIGS. 7 and 8.

Figure 9:
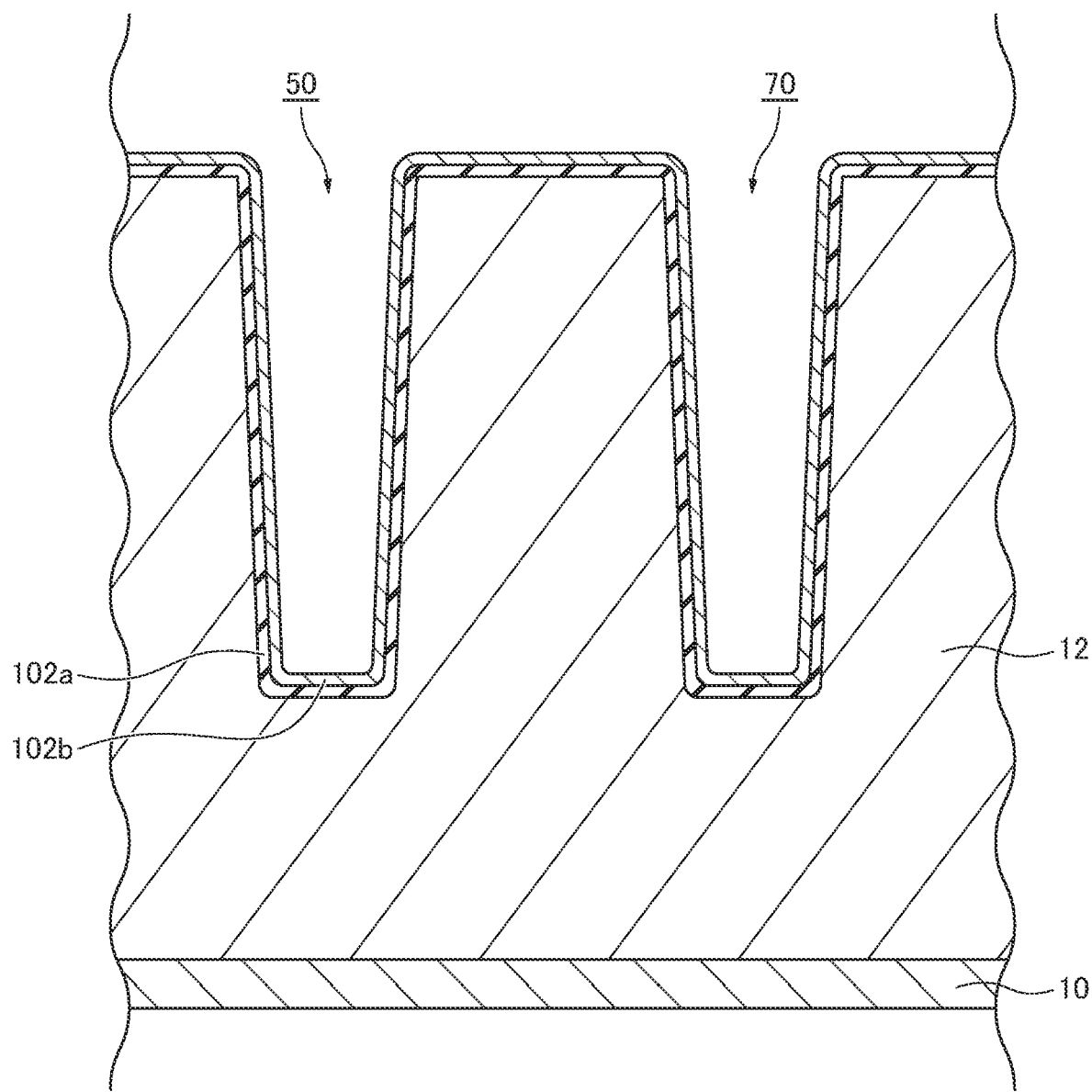
FIG. 9 is a schematic cross-sectional view showing a manufacturing step of a third aspect of the semiconductor device of embodiments.

Then, the layer 102b containing silicon, such as polysilicon or amorphous silicon, is formed on the layer 102a (FIG. 9).

Figure 10:
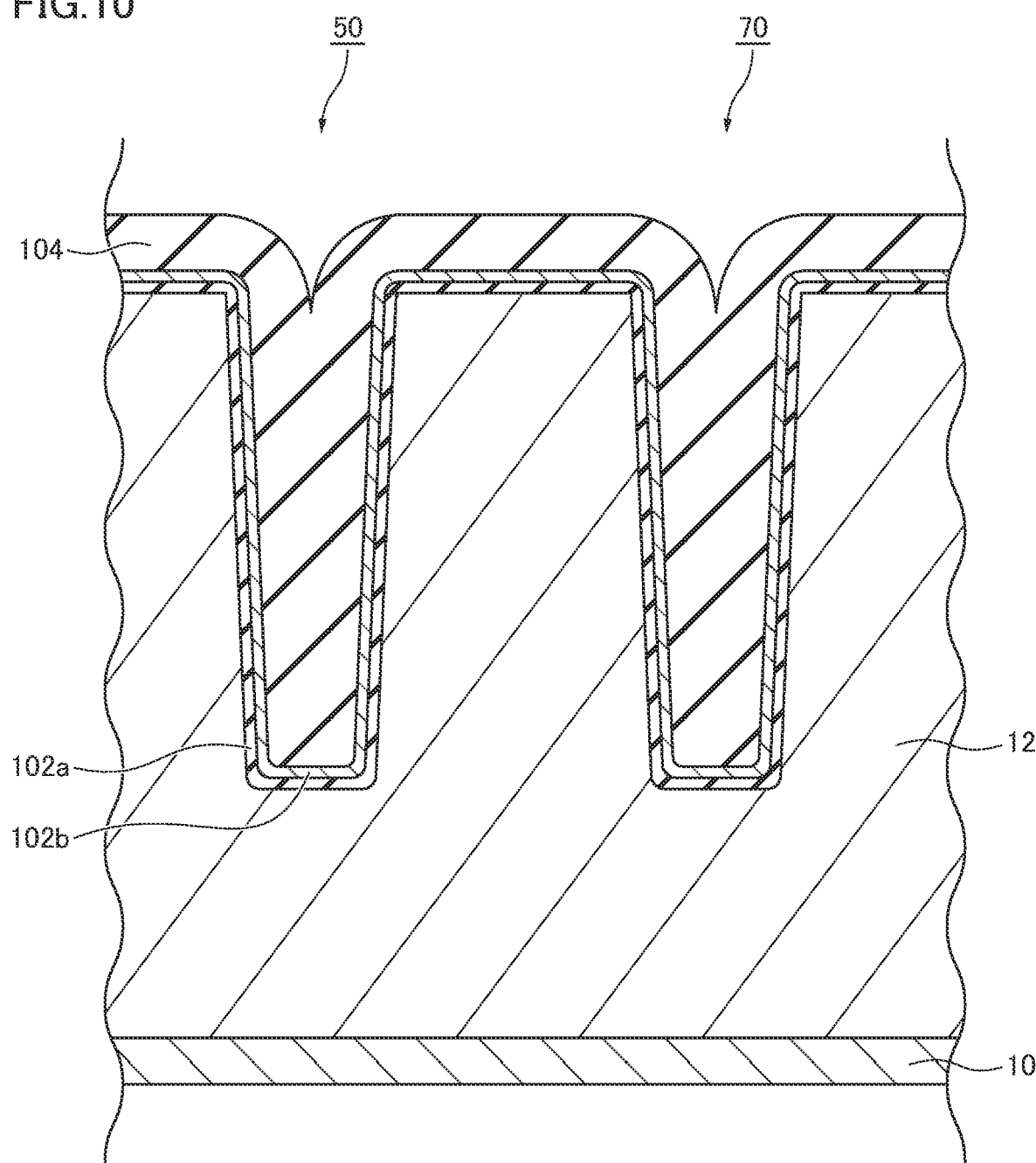
FIG. 10 is a schematic cross-sectional view showing a manufacturing step of a third aspect of the semiconductor device of embodiments.

Then, a layer 104 containing silicon nitride is formed on the layer 102b in the first trench 50 and the second trench 70 and on the layer 102b on the drift layer 12 (FIG. 10).

Figure 11:
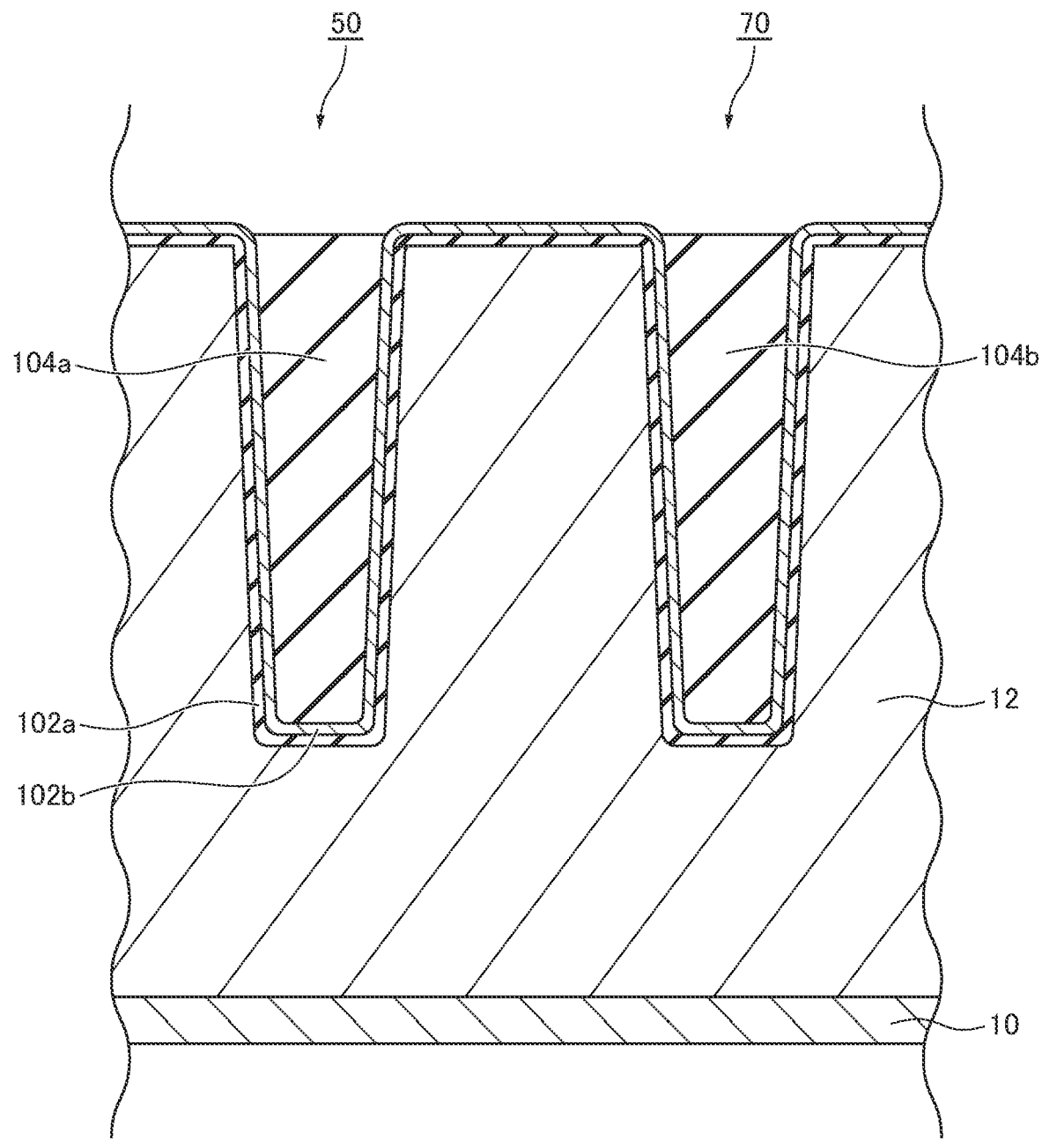
FIG. 11 is a schematic cross-sectional view showing a manufacturing step of the third aspect of the semiconductor device of embodiments.

Then, the layer 104 formed on the drift layer 12 is removed by wet etching using hot phosphoric acid, for example (FIG. 11). The layer 104 in the first trench 50 becomes a layer 104a, and the layer 104 in the second trench 70 becomes a layer 104b.

Figure 12:
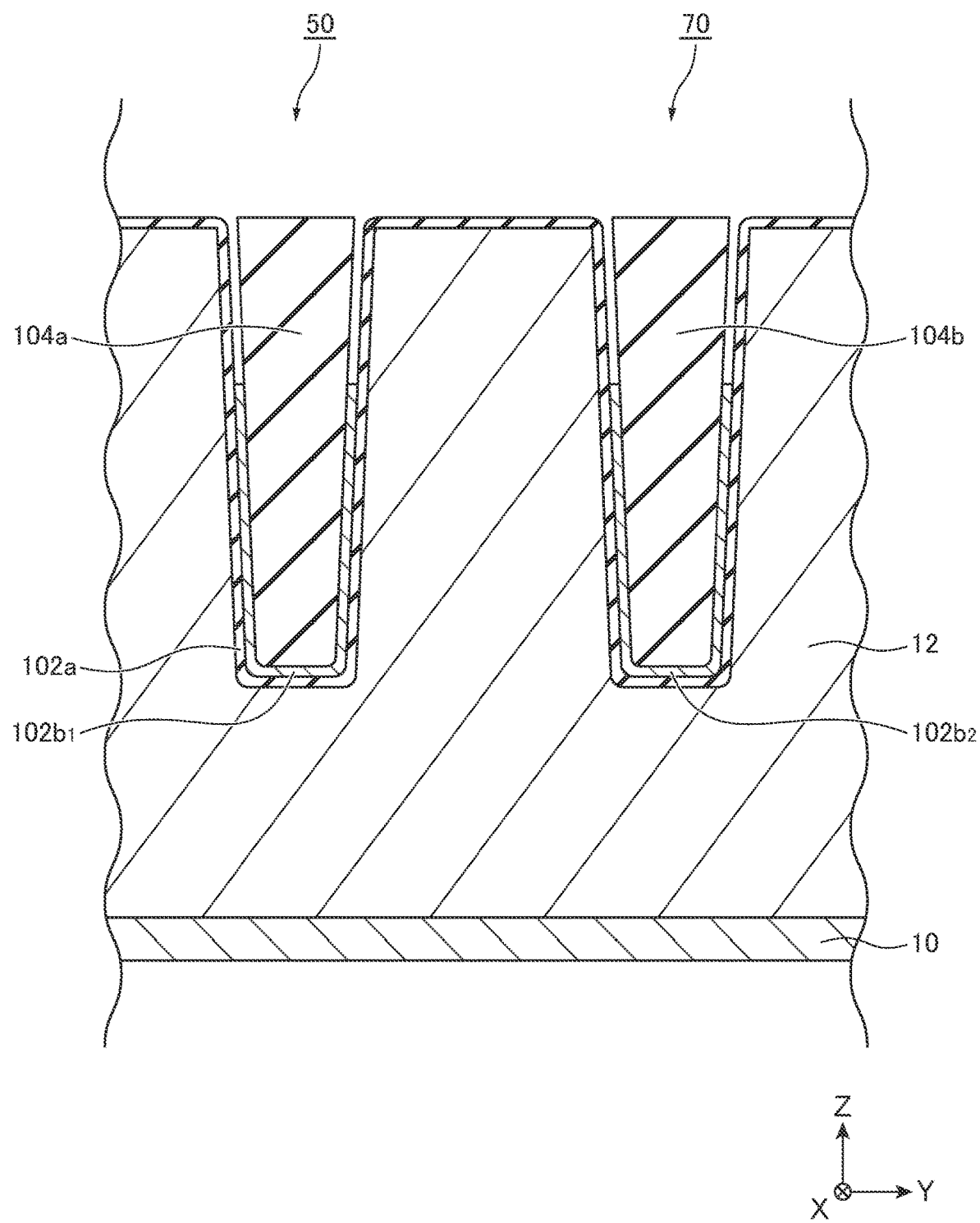
FIG. 12 is a schematic cross-sectional view showing a manufacturing step of the third aspect of the semiconductor device of embodiments.

Then, a part of the layer 102b is removed by, for example, chemical dry etching (CDE). The layer 102b in the first trench 50 becomes a layer $102b_1$, and the layer 102b in the second trench 70 becomes a layer $102b_2$ (FIG. 12).

Figure 13:
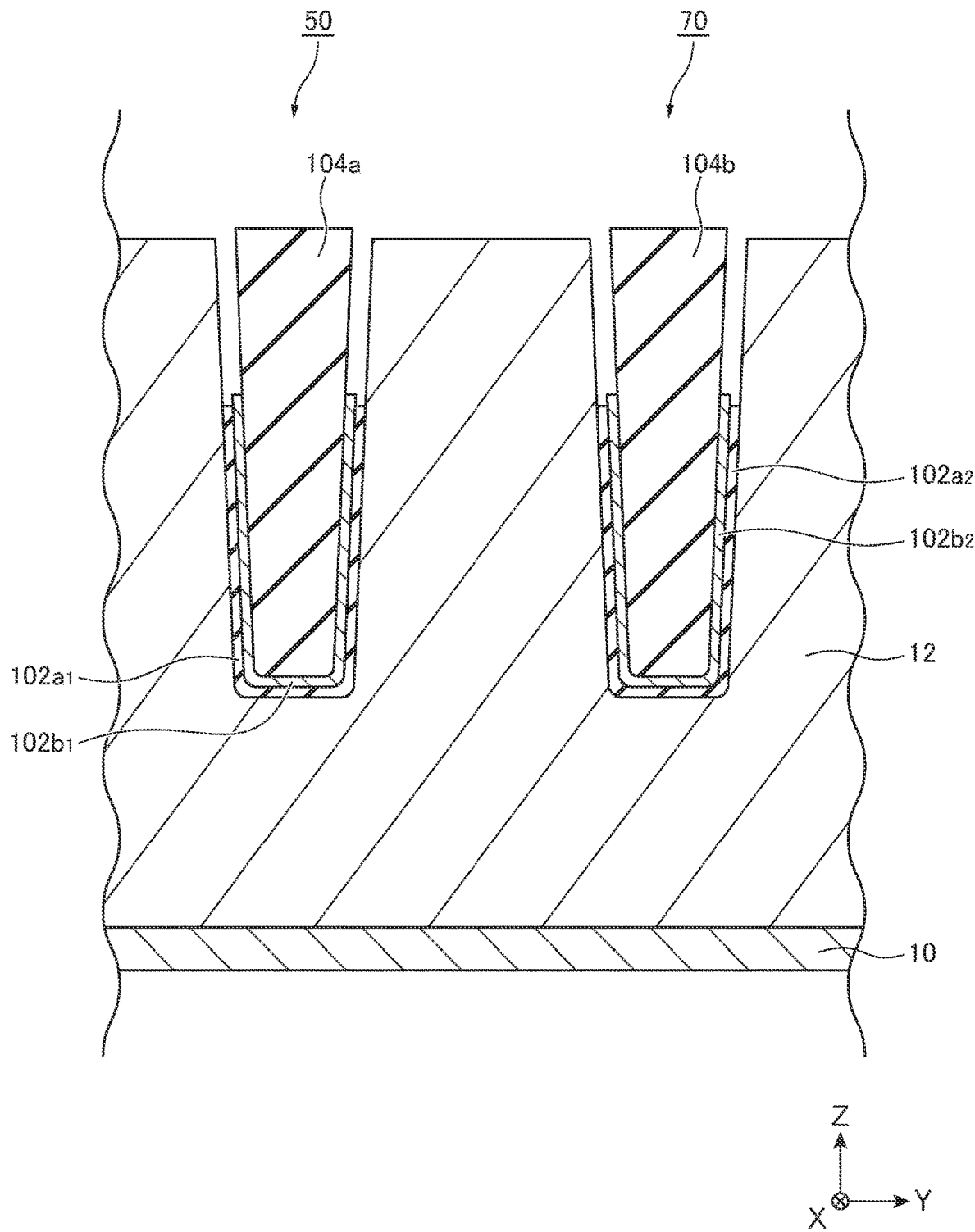
FIG. 13 is a schematic cross-sectional view showing a manufacturing step of the third aspect of the semiconductor device of embodiments.

Then, a part of the layer 102a is removed by wet etching using, for example, buffered hydrofluoric acid (BHF). The layer 102a in the first trench 50 becomes a layer $102a_1$, and the layer 102a in the second trench 70 becomes a layer $102a_2$ (FIG. 13).

Figure 14:
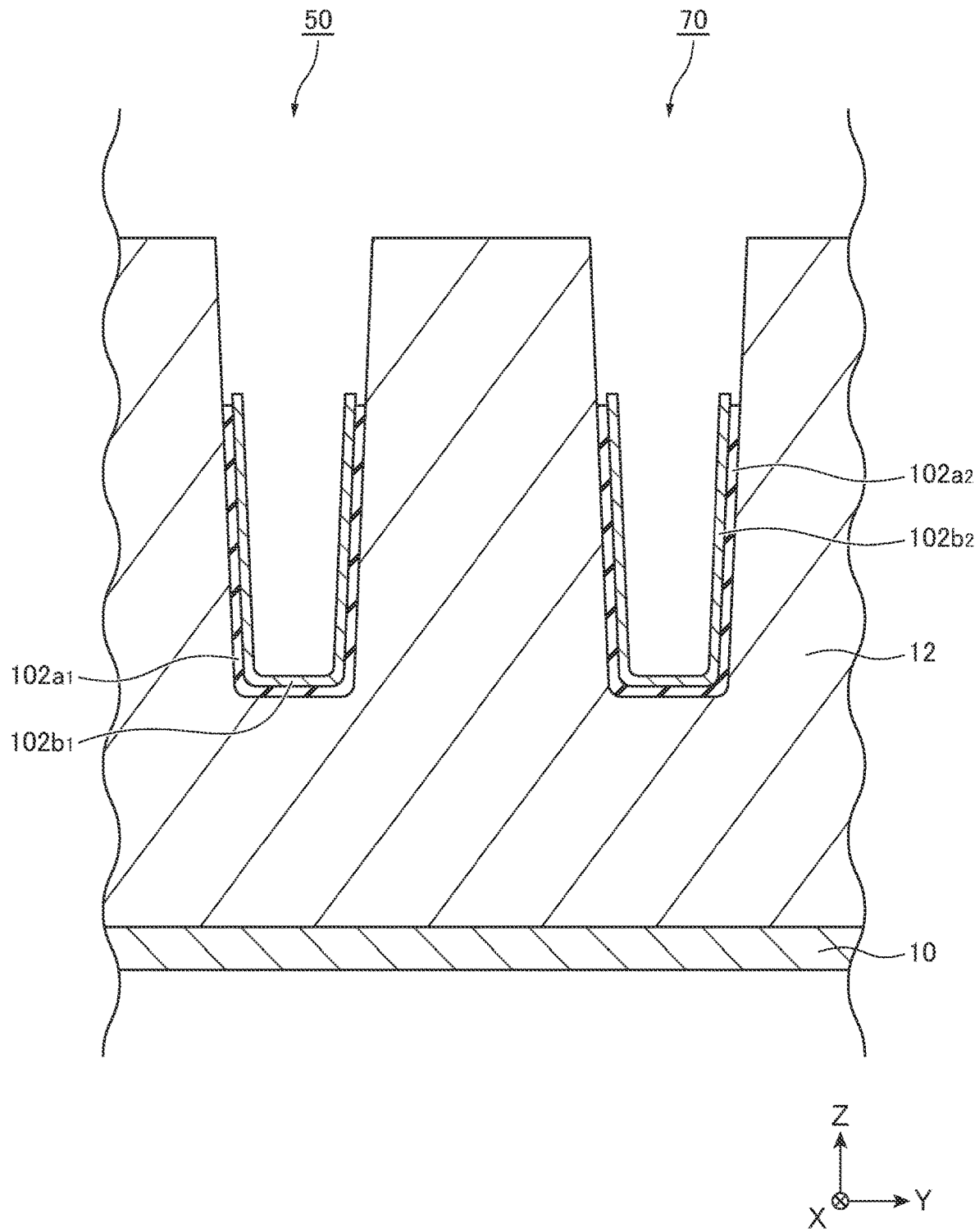
FIG. 14 is a schematic cross-sectional view showing a manufacturing step of the third aspect of the semiconductor device of embodiments.

Then, the layer 104a and the layer 104b are removed by wet etching using hot phosphoric acid, for example (FIG. 14). Then, for example, the insulating layer 52d and the insulating layer 72d are formed on the layer $102b_1$ and the layer $102b_2$, respectively. Then, the layer $102b_1$ and the layer $102b_2$ are thermally oxidized. Then, the first field plate electrode 54, the second field plate electrode 74, the base region 14, the source region 16, the first gate electrode 58, the second gate electrode 78, the interlayer insulating film 60, the barrier metal 36, the source electrode 42, and the drain electrode 38 are appropriately formed to obtain the semiconductor device 100 of embodiments. For example, the semiconductor device 100 of embodiments is manufactured by using the manufacturing method described in JP 2018-046253 A. In addition, the layer $102a_1$, the layer $102b_1$, and a portion of the insulating layer 52d in contact with the layer $102b_1$ in the first trench 50 become the third layer 52a, the first layer 52b, and the second layer 52c, respectively. In addition, the layer $102a_2$, the layer $102b_2$, and a portion of the insulating layer 72d in contact with the layer $102b_2$ in the second trench 70 become the sixth layer 72a, the fourth layer 72b, and the fifth layer 72c, respectively.

Next, the function and effect of the method of manufacturing the semiconductor device of embodiments will be described.

Figure 15:
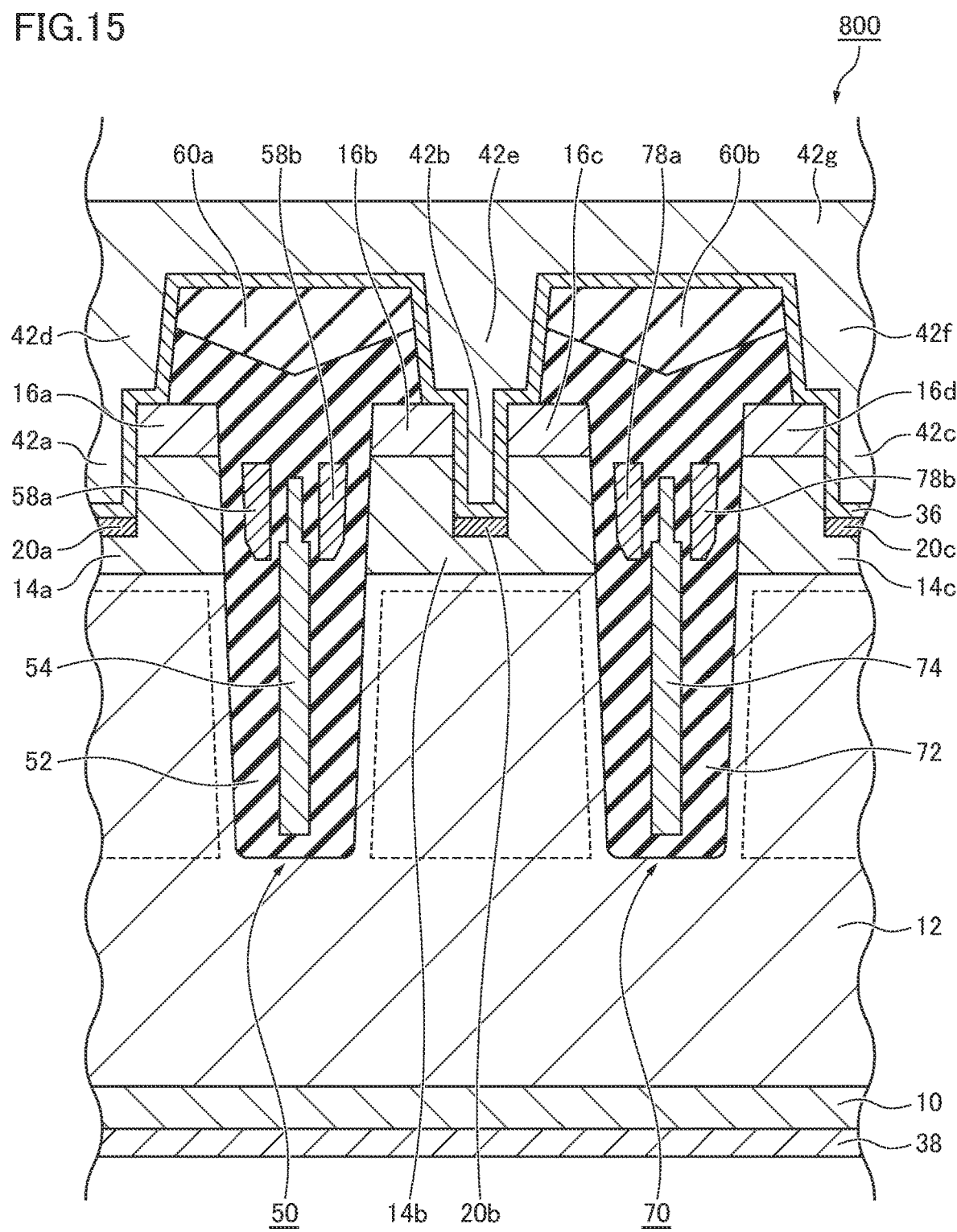
FIG. 15 is a schematic cross-sectional view of a semiconductor device as a comparative form.

FIG. 15 is a schematic cross-sectional view of a semiconductor device 800 as a comparative form. The third layer 52a, the first layer 52b, the second layer 52c, and the insulating layer 52d are not provided in the first trench 50. In the first trench 50, for example, the insulating layer 52 containing silicon oxide formed by a plasma CVD method or a thermal oxidation method is provided. The sixth layer 72a, the fourth layer 72b, the fifth layer 72c, and the insulating layer 72d are not provided in the second trench 70. In the second trench 70, for example, the insulating layer 72 containing silicon oxide formed by a plasma CVD method or a thermal oxidation method is provided.

For example, if the carrier mobility can be improved by introducing strain into Si contained in the drift layer 12, the on-resistance can be reduced. Here, for example, when the carrier is an electron, it is preferable to apply a tensile stress in the Z direction, which is the movement direction of the carrier, in a region shown by the dotted line in the drift layer 12 of FIG. 15.

Therefore, it is conceivable to form an insulating layer, for example, an oxide layer, in the first trench 50 and the second trench 70 in order to apply the tensile stress to the drift layer 12. The insulating layer has a coefficient of thermal expansion different from those of other semiconductor layers. For this reason, it is possible to apply stress to the semiconductor layer by forming an insulating layer on the surface of the semiconductor layer. Therefore, when the insulating layer serves as a stress application source, tensile stress can be applied to the region shown by the broken line in the drift layer 12 adjacent to the insulating layer, so that the on-resistance can be reduced.

Figure 16:
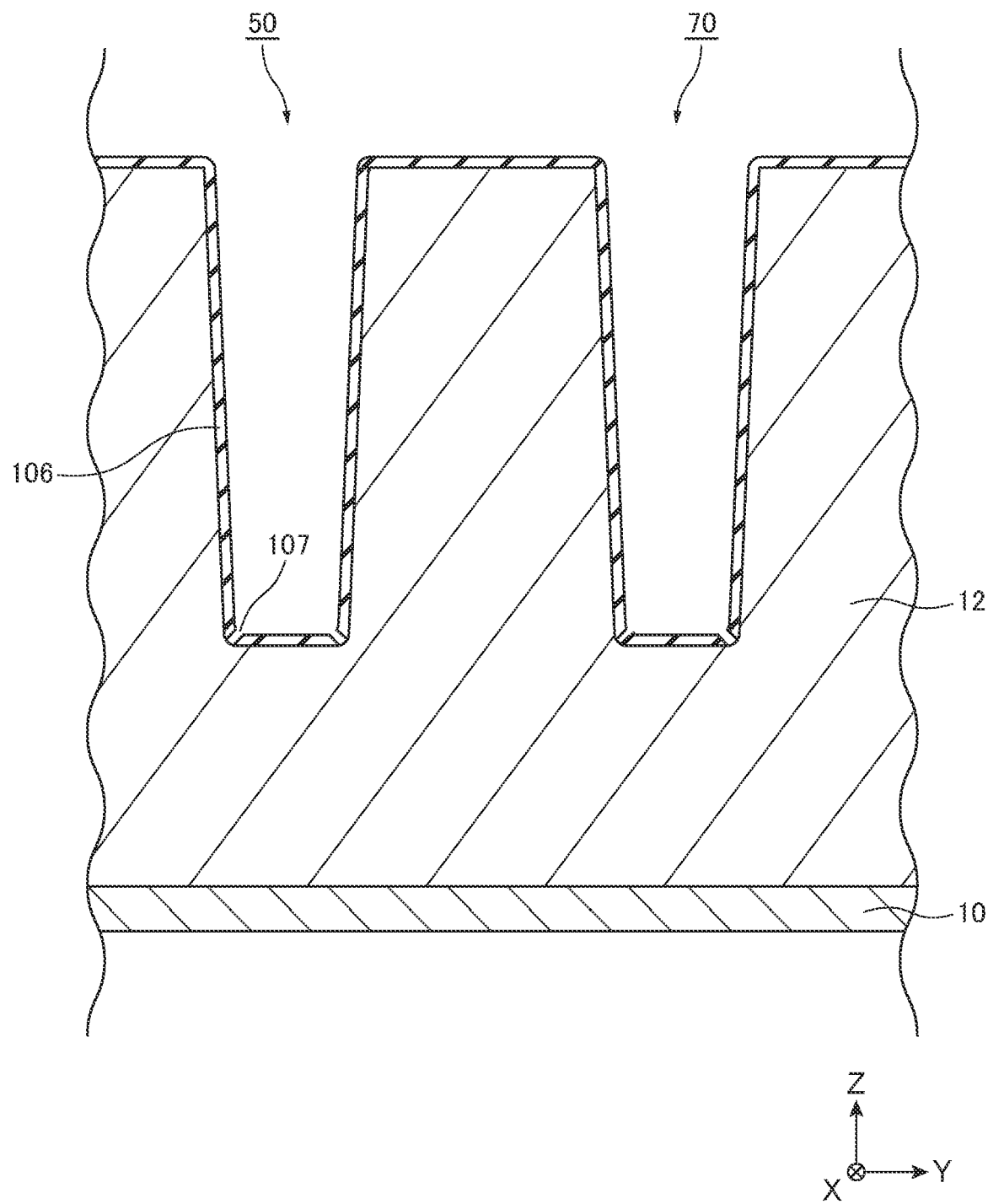
FIG. 16 is a schematic cross-sectional view for describing a method of manufacturing the semiconductor device as a comparative form.

FIG. 16 is a schematic diagram for describing a method of manufacturing a semiconductor device as a comparative form. For example, as an application source of such tensile stress, it is conceivable to form an oxide layer 106 formed by plasma CVD in the first trench 50 and the second trench 70. When the oxide layer 106 is formed by plasma CVD, the residual stress in the oxide layer 106 can be controlled by controlling the low frequency (LF) power. However, when the oxide layer 106 is formed by plasma CVD, the embedding property is low. For this reason, for example, as shown in FIG. 16, it is difficult to form a uniform oxide layer 106 on the inner walls of the first trench 50 and the second trench 70. Therefore, for example, there is a problem that a portion 107 where no oxide layer is formed is generated at the bottoms of the first trench 50 and the second trench 70.

Figure 17:
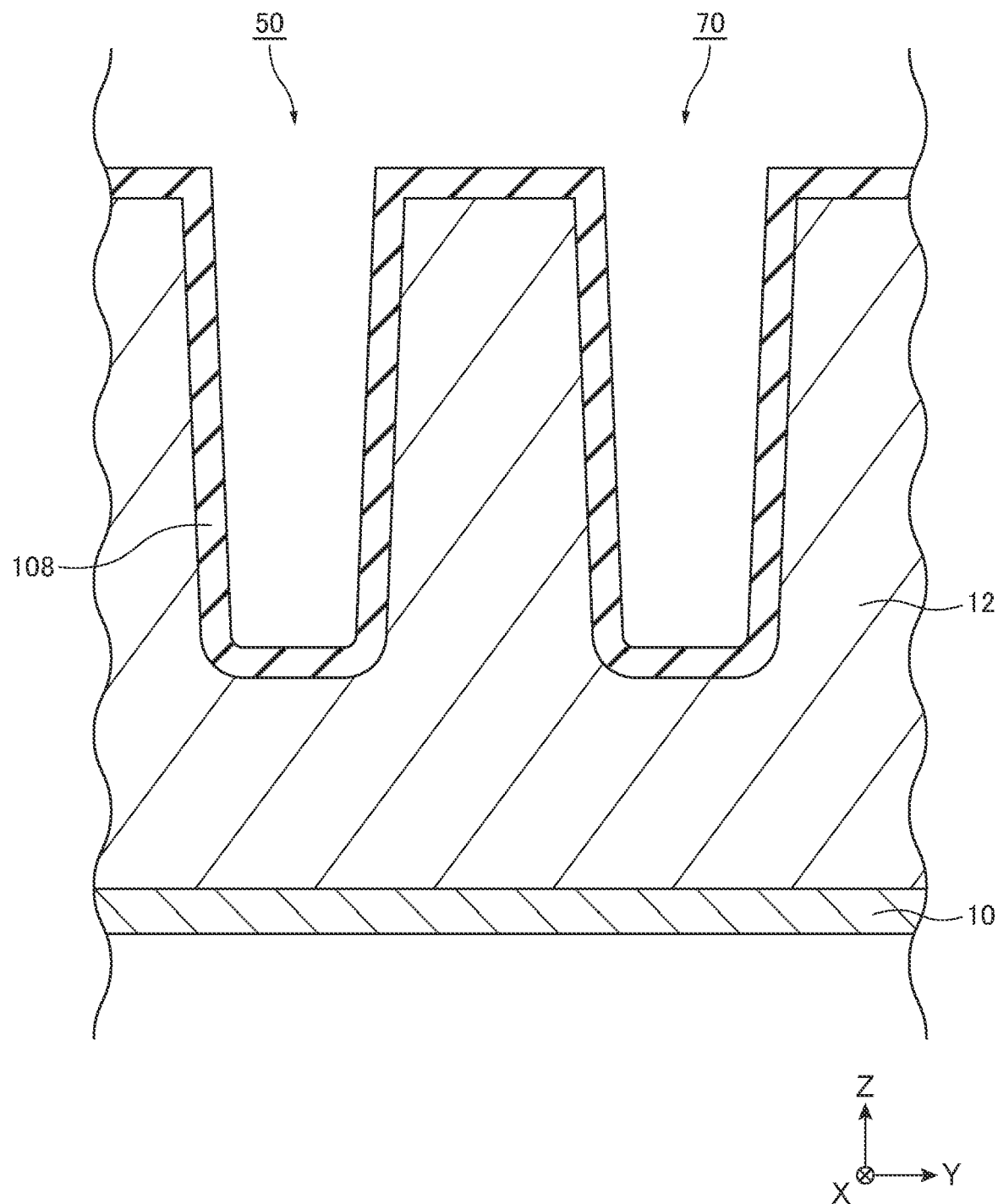
FIG. 17 is a schematic cross-sectional view for describing a method of manufacturing the semiconductor device as a comparative form.

FIG. 17 is a schematic diagram for describing a method of manufacturing a semiconductor device as a comparative form. For example, as an application source of such tensile stress, it is conceivable to form an oxide layer 108 formed by the thermal oxidation method in the first trench 50 and the second trench 70. In the case of the thermal oxidation method, the oxide layer 108 is formed by oxidizing the semiconductor material (for example, Si) on the inner wall of the first trench 50 and the semiconductor material (for example, Si) on the inner wall of the second trench 70. Therefore, the oxide layer 108 can be easily formed with a uniform film thickness with respect to the inner wall of the first trench 50 and the inner wall of the second trench 70 as compared with the oxide layer 106 formed by plasma CVD. In addition, it is possible to control the stress applied to the oxide layer 108 by controlling the formation parameters such as the temperature used for thermal oxidation. However, when the oxide layer 108 is formed by the thermal oxidation method, the semiconductor material on the inner wall of the trench is oxidized as described above. Accordingly, the width of the drift layer 12 between the adjacent trenches is reduced. For this reason, there is a problem that it is difficult to control the width of the drift layer 12 particularly when increasing the number of trenches to increase the degree of integration.

Therefore, in the method of manufacturing a semiconductor device of embodiments, a trench is formed in a semiconductor layer of first conductivity type, the layer 102b containing silicon, such as polysilicon or amorphous silicon, or the layer 102c containing the first oxide or nitride is formed in the trench. When the layer 102b is formed, the layer 102c is formed on the layer 102b, and when the layer 102c is formed, the layer 102b is formed on the layer 102c. Then, the layer 102b is thermally oxidized.

Figure 18:
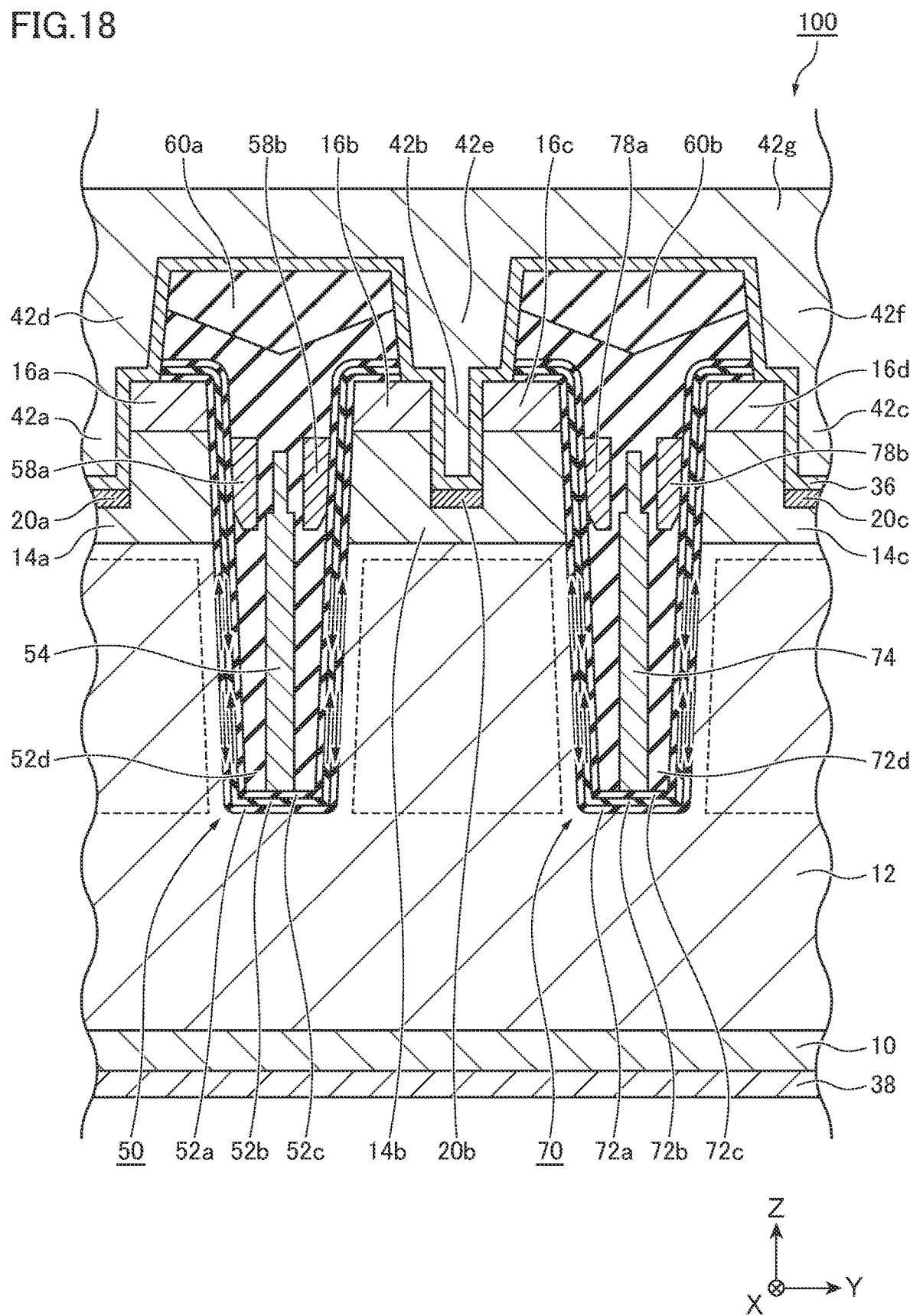
FIG. 18 is a schematic cross-sectional view for describing the function and effect of the semiconductor device of embodiments.

FIG. 18 is a schematic cross-sectional view for describing the function and effect of the method of manufacturing a semiconductor device of embodiments.

When the layer 102b is thermally oxidized, the thermally oxidized layer 102b can apply tensile stress to a region shown by the broken line in the drift layer 12 through the inner wall of the trench. This makes it possible to reduce the on-resistance of the MOSFET.

For example, when the layer 102c is formed on the layer 102b and the layer 102b is thermally oxidized, the layer 102b is confined between the inner wall of the trench and the layer 102c. For this reason, the tensile stress is more easily transmitted to the drift layer as compared with a case where the upper part of the layer 102b is open.

When the layer 102a containing the second oxide is formed by the thermal oxidation method before forming the layer 102b or the layer 102c, the amount of layers formed by the thermal oxidation method can be reduced by the amount of layers 102b and 102c formed. Therefore, since the problem that the width of the drift layer 12 between the adjacent trenches is reduced is unlikely to occur, it becomes easy to increase the number of trenches to increase the degree of integration. In addition, it is preferable that the second oxide is a silicon oxide because this is easy to manufacture.

As described above, when polysilicon is oxidized, for example, the film thickness expands about twice. Therefore, since a large stress is generated due to such expansion, it is possible to easily apply the stress to the drift layer 12. In addition, due to the oxidation of polysilicon grains, silicon oxide grains are formed.

It is preferable that the layer 102c contains silicon oxide, which is the first oxide, or silicon nitride, which is a nitride. This is because all of these are easy to manufacture.

By repeating the formation of the layer 102b and the layer 102c, a larger tensile stress can be applied to the drift layer 12.

According to the method of manufacturing a semiconductor device of embodiments, it is possible to provide a method of manufacturing a semiconductor device having a low on-resistance.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming a trench in a semiconductor layer of first conductivity type;
    in the trench, forming a first layer containing silicon on an inner surface of the trench and then forming a second layer containing first oxide or nitride on the first layer, or forming the second layer on the inner surface of the trench and then forming the first layer on the second layer; and
    thermally oxidizing the first layer.

2. The method of manufacturing a semiconductor device according to claim 1,
    wherein, before the first layer or the second layer is formed after the trench is formed, a third layer containing second oxide is formed in the trench using a thermal oxidation method.

3. The method of manufacturing a semiconductor device according to claim 1,
    wherein the semiconductor layer contains silicon, and the first layer contains polysilicon.

4. The method of manufacturing a semiconductor device according to claim 3,
    wherein the thermally oxidized first layer contains silicon oxide grains.

5. The method of manufacturing a semiconductor device according to claim 1,
    wherein the second layer contains silicon oxide as the first oxide.

6. The method of manufacturing a semiconductor device according to claim 1,
    wherein the second layer contains silicon nitride as the nitride.

7. The method of manufacturing a semiconductor device according to claim 1,
    wherein the second layer is formed by using a CVD method.

8. The method of manufacturing a semiconductor device according to claim 1,
    wherein the formation of the first layer and the second layer is repeated.

9. The method of manufacturing a semiconductor device according to claim 1,
    wherein, after the first layer is thermally oxidized, a first electrode is formed in the trench, a first semiconductor region of second conductivity type is formed on the semiconductor layer, a second semiconductor region of first conductivity type is formed on the first semiconductor region, a second electrode is formed on the second semiconductor region, and a third electrode is formed below the semiconductor layer.

* * * * *